US008089139B2

(12) United States Patent
Shi et al.

(10) Patent No.: US 8,089,139 B2
(45) Date of Patent: Jan. 3, 2012

(54) SMALL OUTLINE PACKAGE IN WHICH MOSFET AND SCHOTTKY DIODE BEING CO-PACKAGED

(75) Inventors: Zhengyu Shi, Shanghai (CN); Limin Wang, Shanghai (CN); Lei Shi, Shanghai (CN)

(73) Assignee: Alpha & Omega Semiconductor, Ltd. (BM)

( * ) Notice: Subject to any disclaimer, the term of this patent is extended or adjusted under 35 U.S.C. 154(b) by 378 days.

(21) Appl. No.: 11/792,010

(22) PCT Filed: Oct. 9, 2005

(86) PCT No.: PCT/CN2005/001658
§ 371 (c)(1),
(2), (4) Date: Dec. 31, 2007

(87) PCT Pub. No.: WO2006/058477
PCT Pub. Date: Jun. 8, 2006

(65) Prior Publication Data
US 2008/0197458 A1 Aug. 21, 2008

(30) Foreign Application Priority Data
Nov. 30, 2004 (CN) .......................... 2004 1 0084702

(51) Int. Cl.
*H01L 23/495* (2006.01)
(52) U.S. Cl. ........ 257/668; 257/152; 257/213; 257/267; 257/288; 257/401

(58) Field of Classification Search .................. 257/144, 257/152, 213, 267, 288, 341, 401, 668, 675, 257/678, E27.04, E29.338, E21.359, E21.368
See application file for complete search history.

(56) References Cited

U.S. PATENT DOCUMENTS

| 4,801,983 | A | 1/1989 | Ueno et al. |
| 5,814,884 | A * | 9/1998 | Davis et al. .................... 257/723 |
| 5,977,630 | A | 11/1999 | Woodworth et al. |
| 6,066,890 | A * | 5/2000 | Tsui et al. ...................... 257/723 |
| 6,144,093 | A | 11/2000 | Davis et al. |
| 6,448,643 | B2 * | 9/2002 | Cheah et al. ................... 257/723 |
| 2003/0062601 | A1 * | 4/2003 | Harnden et al. ............... 257/666 |
| 2004/0135248 | A1 | 7/2004 | Takagawa et al. |

FOREIGN PATENT DOCUMENTS

| JP | 2003-258194 A | 9/2003 |
| JP | 2003258194 A * | 9/2003 |

* cited by examiner

*Primary Examiner* — N Drew Richards
*Assistant Examiner* — Joannie A Garcia
(74) *Attorney, Agent, or Firm* — Bo-In Lin

(57) ABSTRACT

A TSOP (Thin Small Outline Package) contains a MOSFET and a Schottky diode. The MOSFET has a source terminal a gate terminal and a drain terminal. The Schottky diode has a cathode terminal, a anode terminal. The TSOP contains the MOSFET and the Schottky diode with a special configuration by placing the drain terminal of the MOSFET and the anode terminal of the Schottky diode on a same side. Specifically, the TSOP implements a leadframe that comprises a plurality of leads. The drain terminal of the MOSFET and the anode terminal extends outside of the TSOP separate on the same side of the package.

10 Claims, 3 Drawing Sheets

SMALL OUTLINE PACKAGE IN WHICH MOSFET AND SCHOTTKY DIODE BEING CO-PACKAGED

This application claims priority to pending PCT Application PCT/CN2005/001658 filed on Oct. 9, 2005 claiming a Priority date of Oct. 30, 2004 filed by the Applicants of this Patent Application.

BACKGROUND OF THE INVENTION

1. Field of the Invention

The invention disclosed herein relates generally to a compact packaging configuration with narrow package width. More particularly, this invention relates to a novel and improved device layout and packaging configuration for combining a metal oxide semiconductor field effect transistor (MOSFET) and a Schottky diode into a narrow and compact TSOP (thin small outline package).

2. Description of the Prior Art

Referring to FIG. 1 for a DC-to-DC power converter that is becoming increasingly more important because such devices are now being implemented in more and more portable power electronic devices. Conventional packages combine a narrow MOSFET device 20' with a Schottky diode 30' into a dual-chip leadframe package as shown in FIG. 2. The first lead 1' of the leadframe is for the A (anode) terminal of the Schottky diode 30' having a T shape structure. The second lead 2' of the leadframe is for the S (source) terminal having an I-shaped structure. The third lead 3' of the leadframe is for the G (gate) terminal of the MOSFET 20' having a T-shaped structure. The fourth lead 4' of the leadframe is connected to the D (drain) terminal of the MOSFET 20' is connected to the first metal contact 11' of the MOSFET device 20'. The fifth lead 5' of the leadframe is open and having an I-shape structure. The sixth lead 6' of the leadframe is for the K (cathode) terminal of the Schottky diode and is connected to the second contact 12' of the Schottky diode 20'.

The above-described package configuration is commonly implemented for connecting between a battery and a protective switch. However, such packaging configuration encounters several technical difficulties when implemented in a DC-DC converter with the circuit diagram shown in FIG. 1. Referring to FIG. 3 for a configuration to incorporate the DC-DC converter of FIG. 1 contained in a dual-chip TSOP package of FIG. 2 in a portable electronic device. An electric current is transmitted through an inductor L, i.e., the circuit node 40' in FIG. 1, to the first lead 1', i.e., the A-terminal of the Schottky diode that constituting an external electric current. Then the current is transmitted through the Schottky diode 30' toward to the sixth lead 6', i.e., the K-terminal of the Schottky diode 30' constituting an internal current. Then the current is transmitted along an output direction "OUT" as shown in FIG. 3. With such packaging configuration, the external current is transmitted through a long current path as illustrated above. Since a longer current path would adversely affect efficiency of the voltage converter, the conventional packaging configuration as shown limits the voltage conversion efficiency. Additionally, a current path further complicates the circuit design thus adversely affects the design processes and also the production cost of the DC-DC converter.

Therefore, a need exists in the art of electronic device packaging to provide new and improved packaging configuration to resolve the difficulties and limitations discussed above.

SUMMARY OF THE PRESENT INVENTION

It is therefore an aspect of the present invention to provide an improved layout and packaging configuration for the power MOSFET and Schottky diode with a new configuration of TSOP package to overcome the aforementioned difficulties encountered in the prior art.

Specifically, it is an aspect of the present invention to provide an improved TSOP package configuration to contain a MOSFET device with a Schottky diode by arranging the D terminal on the same side as the K-terminal of the Schottky diode to simplify the external connection such that the current path may be shortened. Improvement of DC-DC conversion efficiency is achieved with shortened current path. The circuit designs are simplified and the battery life is extended with improved conversion efficiency and shorter current path.

In order to achieve these purposes, a new and improved TSOP package is disclosed. The package includes a leadframe with a second lead for an S-terminal of a MOSFET device contained therein. A third lead of the leadframe is for the G-terminal of the MOSFET and the fourth lead is for the D1 terminal of the MOSFET, and the fifth lead for the D2 terminal of the MOSFET wherein the D2 terminal may be a backup terminal for the D1 terminal of the MOSFET device. The fourth lead of D1 terminal is connected to the first carrier plate of the MOSFET such that the D terminal of the MOSFET is on the same side with the K-terminal of the Schottky diode. Specifically, the first lead of the leadframe is for the K terminal of the Schottky diode and is connected to the second carrier plate for supporting the Schottky diode and the sixth lead is for the A terminal of the Schottky diode. With such layout configuration, the current path is significantly shortened. The voltage conversion efficiency is improved. The complexity of the lead arrangements in a printed circuit board (PCB) is also simplified. The sixth lead for the A-terminal has a T-shape structure. The second lead for wire bonding has a L-shape structure thus enhancing the security of wire attachment with increased wire bonding areas. The fifth lead is connected to the carrier plate for the MOSFET thus improves the heat dissipation and further improves the structural integrity. The length for wire bonding of the sixth lead may be extended for increasing the numbers of wires bonded to the area.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENTS

Figure 1:
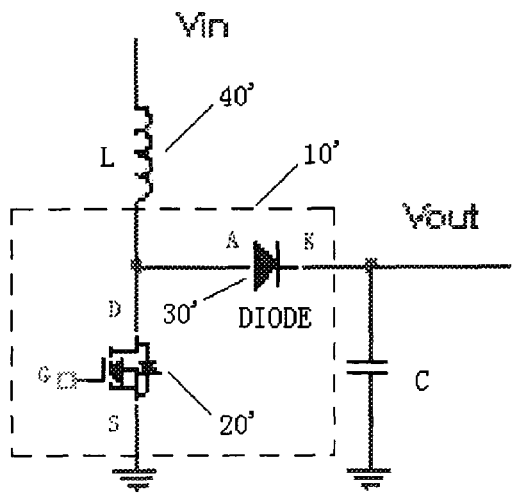
FIG. 1 is a circuit diagram for showing a conventional DC-DC converter.
Figure 2:
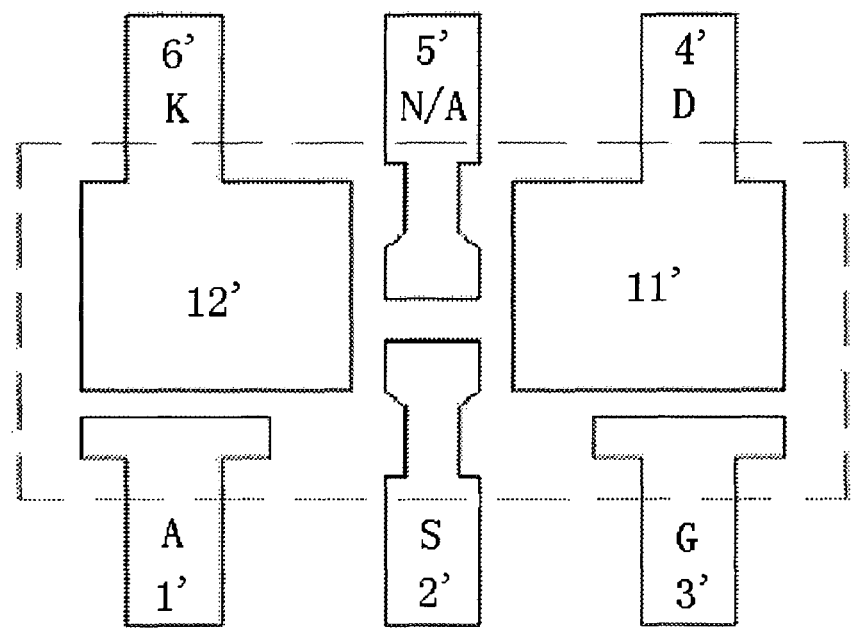
FIG. 2 is a top view for showing a conventional packaging configuration of a MOSFET combined with a Schottky diode in a TSOP package.
Figure 3:
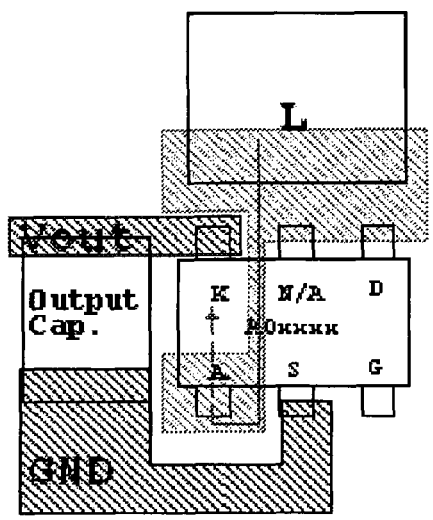
FIG. 3 is a top view of actual implementation and the current path of a DC-DC converter of the TSOP package of FIG. 2.
Figure 4:
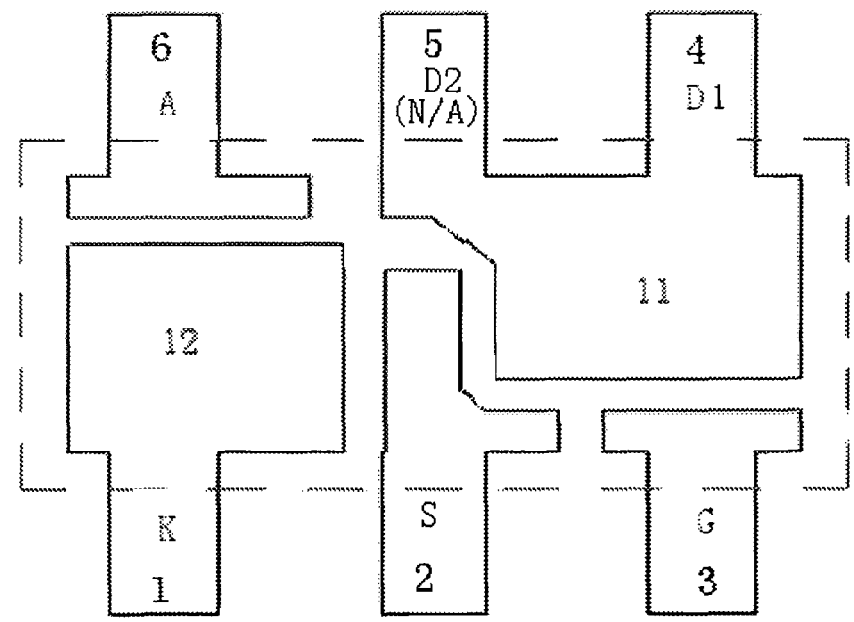
FIG. 4 is a top view for showing an improved layout configuration of the MOSFET and Schottky diode in a DC-DC converter of this invention.
Figure 5:
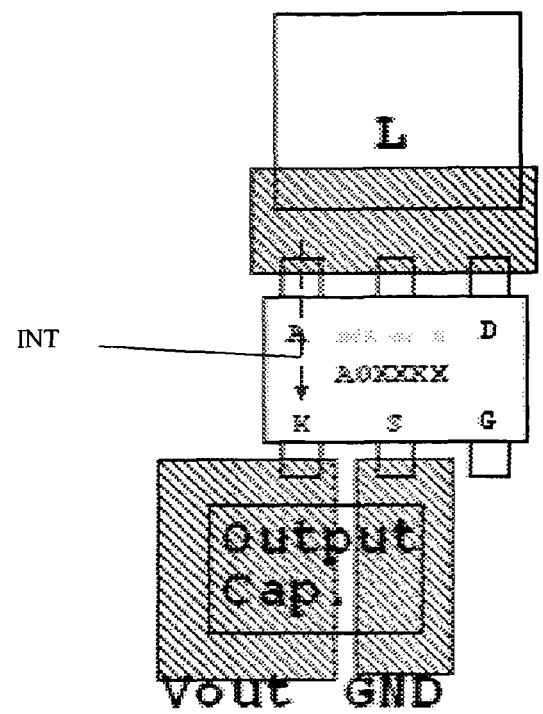
FIG. 5 shows a top view of actual implementation and the current path of a DC-DC converter of the TSOP package of FIG. 4.

Referring to FIGS. 4 to 5 for a six-lead TSOP package containing a MOSFET device and Schottky diode as a preferred embodiment of this invention.

Figure 6:
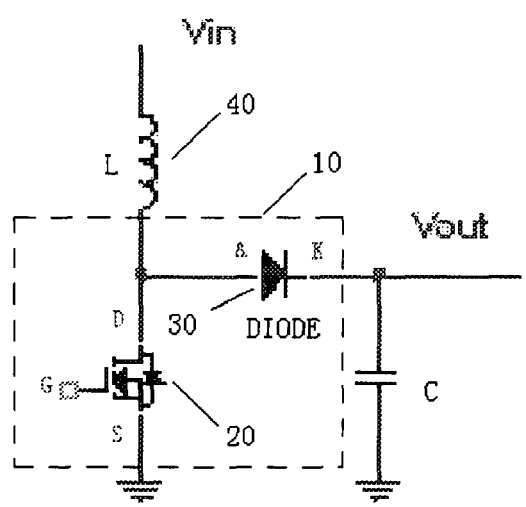
FIG. 6 is a circuit diagram for showing the improved DC-DC converter corresponding to the new layout configuration as that shown in FIGS. 4 and 5.

Referring to FIG. 4 for the six-lead TSOP package containing a MOSFET device and Schottky diode that includes a leadframe 10 having six leads. The second lead 2 of the lead frame is for the S terminal of the MOSFET device, the third lead 3 of the lead frame is for the G-terminal of the MOSFET, the fourth lead 4 of the lead frame is for the D1 terminal of the MOSFET, the fifth lead 5 of the leadframe is either an open ended lead or may be a backup connection to D2 terminal of the MOSFET that may not be necessary depending the applications in different portable electronic devices. The fourth lead 4 of the lead frame for the D1 terminal of the MOSFET is also connected to the carrier plate 11 of the MOSFET 20 as shown in FIG. 6. Furthermore, the fourth lead 4 of the leadframe and the sixth lead 6 of the leadframe for the A terminal of the Schottky diode 30 is arranged to be on the same side of the leadframe. The leadframe further includes a first lead 1 for the K terminal of the Schottky diode 30 and is connected to the carrier plate of the Schottky diode 30.

The sixth lead 6 for the A terminal of the Schottky diode has a T-shape structure and the second lead 2 for the S terminal of the MOSFET has a L-shape structure further enhances the structure integrity and increases the area for wire bonding. The fifth lead 5 is connected to the carrier plate 11 of the MOSFET to provide enhancement of the heat dissipation and improve the structural integrity. The sixth lead 6 has an extended length for wire bonding to increase the number of wires that may be bonded to the lead thereon.

Referring to FIG. 5 for an actual implementation of the leadframe as shown in FIG. 4 with a diagram shown in FIG. 6. The inductive current 40 through inductor L as an external current passes through the sixth lead for the A terminal of the Schottky diode 30 and transmitted in a shortest length through the Schottky diode 30 to the K terminal of the Schottky diode as an internal current shown as INT in FIG. 5. Clearly, the current path is significantly shortened in this new packaging configuration thus increases the conversion efficiency, simplifies the circuit designs, and prolong the battery life implemented with this new and improved MOSFET-Schottky combined package.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A TSOP (Thin Small Outline Package) containing a MOSFET and a Schottky diode wherein:
   a first non-square-or-rectangular-shaped carrier plate supports said MOSFET wherein said MOSFET further comprises a source terminal, a gate terminal, and a drain terminal;
   a second non-square-or-rectangular-shaped carrier plate supports said Schottky diode wherein said Schottky diode further comprises a cathode terminal and an anode terminal; and
   said TSOP enclosed said first and second non-square-or-rectangular-shaped carrier plated therein further includes a leadframe comprising a plurality of leads each connected separately to said source, drain, gate, cathode and anode terminals wherein a first lead connected to said drain terminal and a second lead connected to said anode terminal are arranged to extend from the same side as a first side of the leadframe and extend outside of said TSOP.

2. The TSOP according to claim 1 further comprising:
said first and second irregular shaped carrier plates having mutual complimentary shapes for enclosing in said leadframe having a rectangular shape.

3. The TSOP according to claim 2 wherein:
said leadframe further comprises a third lead extended along a same side as said first and second lead of said leadframe from said first non-square-or-rectangular-shaped carrier plate provided for electrically connecting to said MOSFET.

4. The TSOP according to claim 2 wherein:
said second lead connected to said anode terminal of said Schottky diode extends from said leadframe near said second carrier non-square-or-rectangular-shaped plate supporting said Schottky diode.

5. The TSOP according to claim 4 wherein:
said TSOP comprises said MOSFET and said Schottky diode further configured to function as a DC-DC converter wherein said first and second leads extended from a same side of said leadframe are electrically connected inside or outside of said TSOP package.

6. The TSOP according to claim 2 wherein:
said leadframe further comprises a fourth lead electrically connected to a source terminal of said MOSFET having a L-shaped extended from a second side opposite said first side of said leadframe to provide an increased wire bonding area.

7. The TSOP according to claim 1 wherein:
said second lead electrically connected to said anode of said Schottky diode has a T-shaped structure extended from said first side of said leadframe for providing an increased wire bonding area.

8. The TSOP according to claim 7 wherein:
said second lead with said T-shaped structure has an extended lead length extends outwardly from said leadframe for attaching wires thereon by applying a wire bonding process.

9. The TSOP according to claim 6 wherein:
said leadframe further comprises a fifth lead for electrically connected to said gate terminal of said MOSFET and a sixth lead for electrically connecting to said cathode of said Schottky diode.

10. The TSOP according to claim 5 wherein:
said second lead of said leadframe is further connected to an inductive circuit for shortening an interconnection length to said anode terminal of said Schottky diode implemented in said DC-DC converter.

* * * * *